(12) United States Patent
Tsau et al.

(10) Patent No.: US 8,093,117 B2
(45) Date of Patent: Jan. 10, 2012

(54) METHOD OF FORMING A METAL GATE

(75) Inventors: Hsueh Wen Tsau, Zhunan Township, Miaoli County (TW); Kuang-Yuan Hsu, Fongyuan (TW); Bor-Wen Chan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 12/687,714

(22) Filed: Jan. 14, 2010

(65) Prior Publication Data
US 2011/0171820 A1   Jul. 14, 2011

(51) Int. Cl.
*H01L 21/338* (2006.01)
(52) U.S. Cl. . 438/183; 438/303; 438/592; 438/E21.444; 438/E21.453
(58) Field of Classification Search ............ None
See application file for complete search history.

(56) References Cited

U.S. PATENT DOCUMENTS

| | | | | |
|---|---|---|---|---|
| 6,159,782 A * | 12/2000 | Xiang et al. | | 438/197 |
| 6,271,094 B1 * | 8/2001 | Boyd et al. | | 438/287 |
| 6,440,868 B1 * | 8/2002 | Besser et al. | | 438/721 |
| 6,589,866 B1 * | 7/2003 | Besser et al. | | 438/652 |
| 7,435,636 B1 * | 10/2008 | Hanafi | | 438/183 |
| 2001/0009292 A1 * | 7/2001 | Nishinohara et al. | | 257/402 |
| 2001/0023120 A1 * | 9/2001 | Tsunashima et al. | | 438/585 |
| 2007/0284678 A1 * | 12/2007 | Lin et al. | | 257/412 |
| 2008/0102616 A1 * | 5/2008 | Tsunashima et al. | | 438/591 |
| 2009/0011563 A1 * | 1/2009 | Hanafi | | 438/285 |
| 2009/0233451 A1 * | 9/2009 | Tsunashima et al. | | 438/769 |
| 2010/0044782 A1 * | 2/2010 | Carter et al. | | 257/327 |
| 2011/0031558 A1 * | 2/2011 | Yu et al. | | 257/379 |

OTHER PUBLICATIONS

Hiroshi Horie, et al., "Novel High Aspect Ratio Aluminum Plug for Logic/DRAM LSIs Using Polysilicon-Aluminum Substitute (PAS)", 946-IEDM 96, pp. 14.7.1-14.7.3.

* cited by examiner

*Primary Examiner* — Alonzo Chambliss
(74) *Attorney, Agent, or Firm* — Haynes and Boone, LLP

(57) ABSTRACT

The present disclosure provides a method of fabricating a semiconductor device. The method includes providing a substrate. A dummy gate is formed over the substrate. A dielectric material is formed around the dummy gate. The dummy gate is then removed to form an opening in the dielectric material. Thereafter, a work function metal layer is formed to partially fill the opening. The remainder of the opening is then filled with a conductive layer using one of a polysilicon substitute method and a spin coating method.

20 Claims, 17 Drawing Sheets

METHOD OF FORMING A METAL GATE

TECHNICAL FIELD

The present disclosure relates generally to a method of fabricating a semiconductor device, and more particularly, to a method of fabricating a gate of a semiconductor device.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Some semiconductor fabrication processes require filling a trench or opening with a conductive material, such as a metallic material. However, as the geometry size of the ICs continue to decrease, it is increasingly more difficult to fill the trench or opening with the conductive material without voids or gaps.

Therefore, while existing methods of filling trenches with a conductive material have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
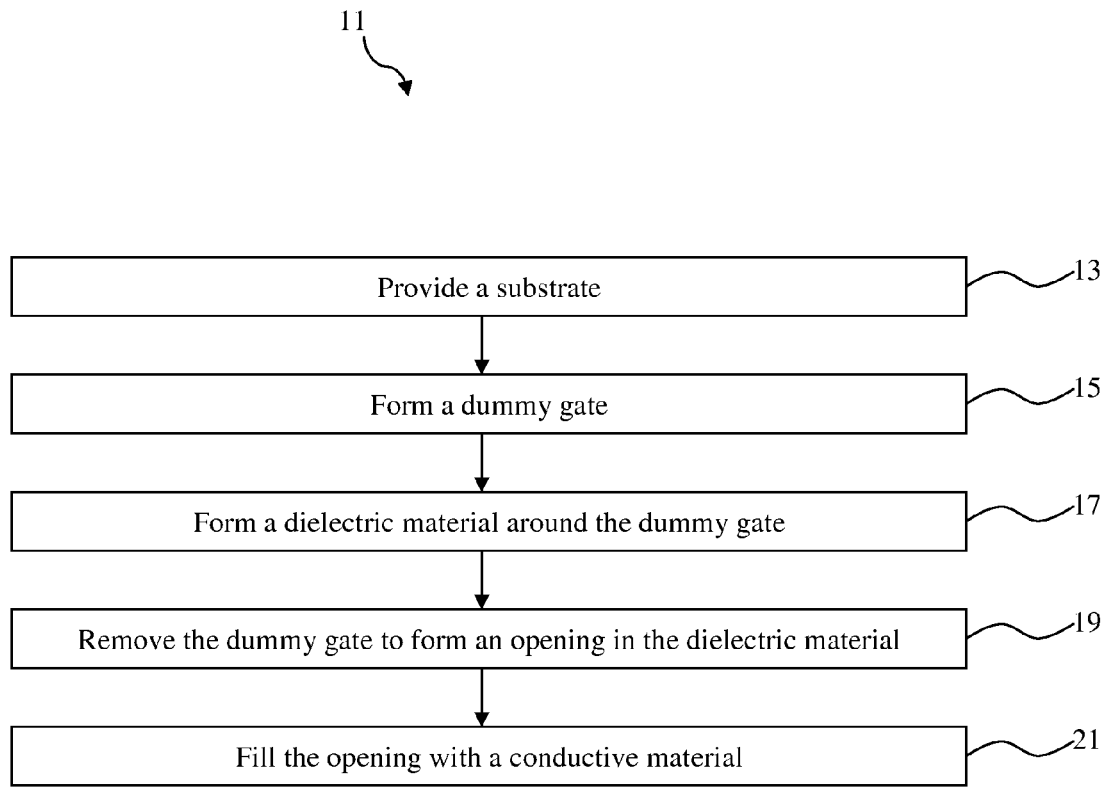
FIG. 1 is a flowchart illustrating a method of fabricating a semiconductor device according to various aspects of the present disclosure.

One of the broader forms of the present disclosure involves a method of fabricating a semiconductor device. The method includes, providing a substrate; forming a dummy gate over the substrate; forming a dielectric material around the dummy gate; removing the dummy gate to form an opening in the dielectric material; forming a silicon material in the opening; forming a first conductive layer over the silicon material; forming a second conductive layer over the first conductive layer; and performing an annealing process in a manner such that the silicon material in the opening is replaced by the first conductive layer.

Another of the broader forms of the present disclosure involves a method of fabricating a semiconductor device. The method includes, providing a substrate; forming a dummy gate over the substrate; forming a dielectric material around the dummy gate; removing the dummy gate to form an opening in the dielectric material; forming a wetting layer in the opening; and forming a conductive layer over the wetting layer in the opening with a spin coating process.

Yet another of the broader forms of the present disclosure involves a method of fabricating a semiconductor device. The method includes, providing a substrate; forming a dummy gate over the substrate; forming a dielectric material around the dummy gate; removing the dummy gate to form an opening in the dielectric material; forming a work function metal layer to partially fill the opening; and filling a remainder of the opening with a conductive layer using one of a polysilicon substitute method and a spin coating method.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 11 for fabricating a semiconductor device. FIGS. 2-17 are diagrammatic fragmentary cross-sectional side views, of the semiconductor device during various fabrication stages. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-17 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIG. 1, the method 11 begins with block 13 in which a substrate is provided. The method 11 continues with block 15 in which a dummy gate is formed over the substrate. The method 11 continues with block 17 in which a dielectric material is formed around the dummy gate. The method 11 continues with block 19 in which the dummy gate is removed to form an opening in the dielectric material. The method 11 continues with block 21 in which the opening is filled with a conductive material.

Figure 2:
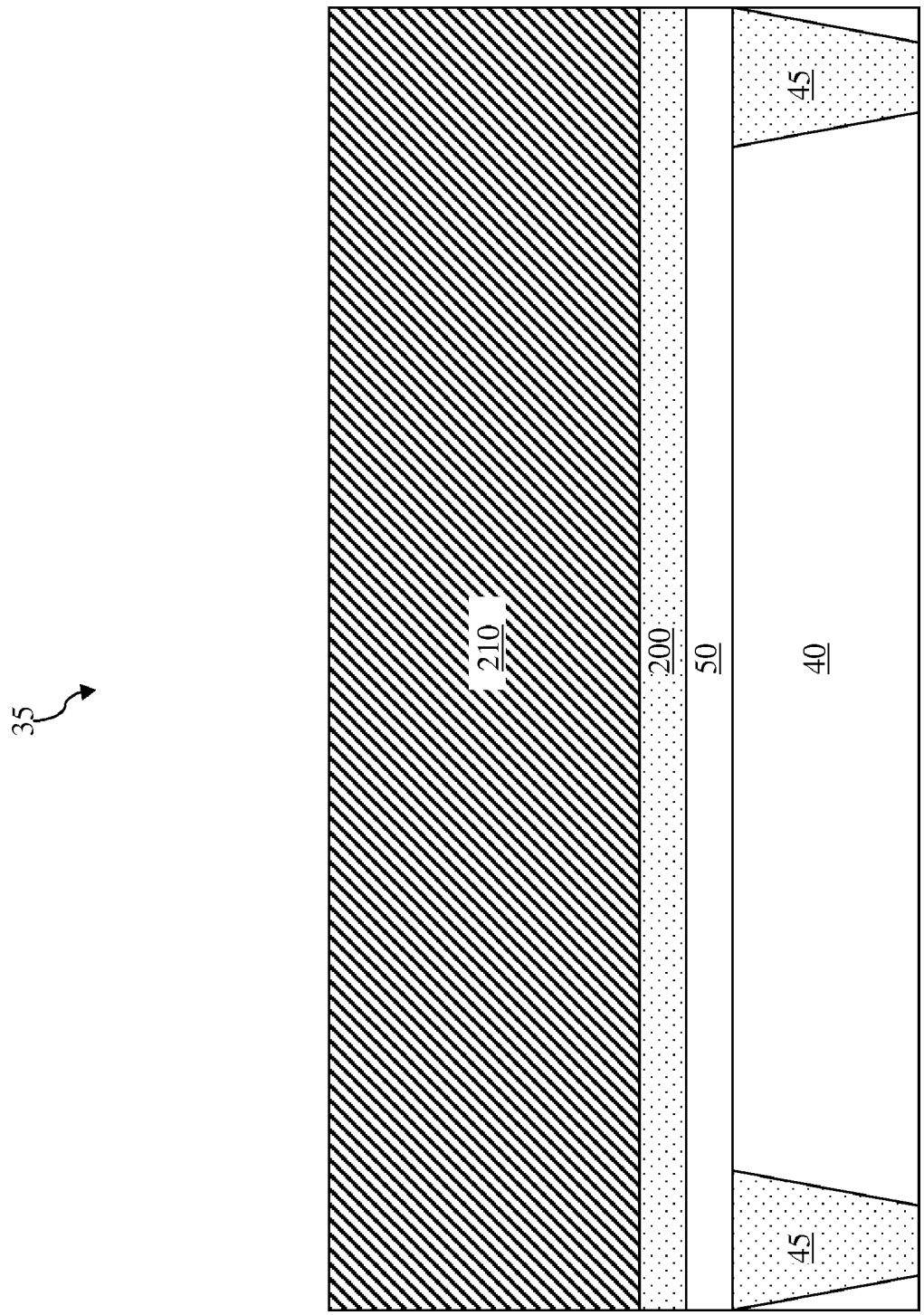
FIGS. 2 to 17 illustrate cross-sectional views of the semiconductor device at various stages of fabrication according to the method of FIG. 1.

Referring to FIG. 2, a semiconductor device 35 is fabricated in accordance with the method 11 of FIG. 1. The semiconductor device 35 has a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Referring back to FIG. 2, shallow trench isolation (STI) features 45 are formed in the substrate 40. The STI features 45 are formed by etching recesses (or trenches) in the substrate 45 and filling the recesses with a dielectric material. In the present embodiment, the dielectric material of the STI features 45 includes silicon oxide. In alternative embodiments, the dielectric material of the STI features 45 may include silicon nitride, silicon oxy-nitride, fluoride-doped silicate (FSG), and/or a low-k dielectric material known in the art.

Thereafter, an interfacial layer 50 is optionally formed over the substrate 40. The interfacial layer 50 is formed by an atomic layer deposition (ALD) process and includes silicon oxide ($SiO_2$).

A gate dielectric layer 200 is then formed over the interfacial layer 50. The gate dielectric layer 200 is formed by an ALD process. The gate dielectric layer 200 includes a high-k dielectric material. A high-k dielectric material is a material having a dielectric constant that is greater than a dielectric constant of $SiO_2$, which is approximately 4. In an embodiment, the gate dielectric layer 200 includes hafnium oxide ($HfO_2$), which has a dielectric constant that is in a range from approximately 18 to approximately 40. In alternative embodiments, the gate dielectric layer 200 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. A gate electrode layer 210 is then formed over the gate dielectric layer 200. The gate electrode layer 210 includes a polysilicon material.

Figure 3:
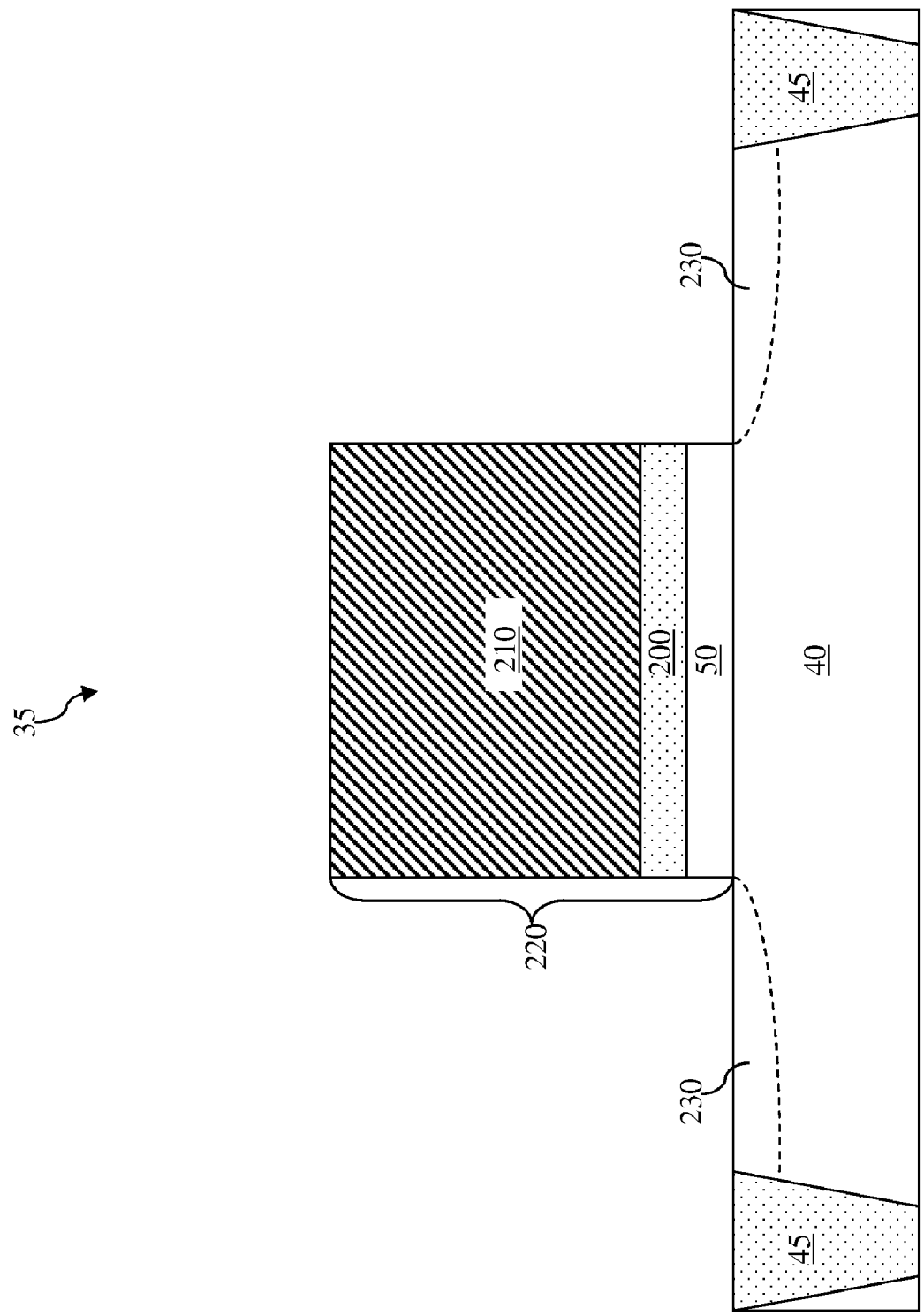

Referring to FIG. 3, the interfacial layer 50, the gate dielectric layer 200, and the gate electrode layer 210 are patterned using a photolithography process known in the art to form a gate structure 220 (also referred to as a gate stack) of the semiconductor device 35. Thereafter, lightly doped source/drain (also referred to as LDD) regions 230 are formed in portions of the substrate 40 on either side of the gate structure 220. The LDD regions 230 may be formed by an ion implantation process or a diffusion process known in the art. N-type dopants such as phosphorus or arsenic may be used to form the semiconductor device 35 as an NMOS device, and P-type dopants such as boron may be used to form the semiconductor device 35 as a PMOS device.

Figure 4:
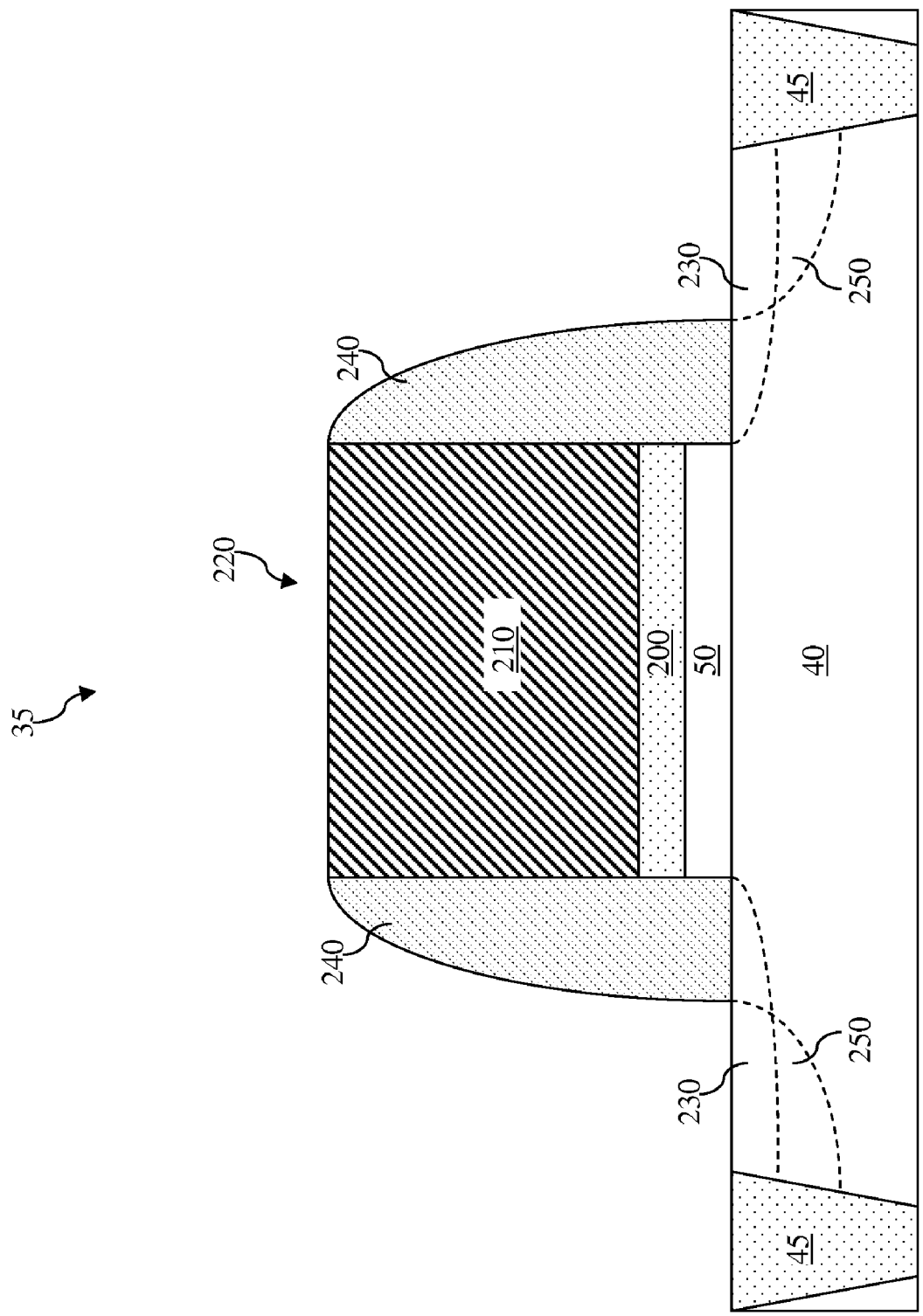

Referring to FIG. 4, gate spacers 240 are formed over the substrate 40 and on sidewalls of the gate structure 220 using a deposition process and an etching process (for example, an anisotropic etching process) known in the art. The gate spacers 240 include a suitable dielectric material such as silicon nitride, silicon oxide, silicon carbide, silicon oxy-nitride, or combinations thereof. Thereafter, heavily doped source and drain regions 250 (also referred to as S/D regions) are formed in portions of the substrate 40 on either side of the gate spacers 240. The S/D regions 250 may be formed by an ion implantation process or a diffusion process known in the art. N-type dopants such as phosphorus or arsenic may be used to form the semiconductor device 35 as an NMOS device, and P-type dopants such as boron may be used to form the semiconductor device 35 as a PMOS device. As is illustrated in FIG. 4, the S/D regions 250 are aligned with the outer boundaries of the gate spacers 240. Since no photolithography process is required to define the area or the boundaries of the S/D regions 250, it may be said that the S/D regions 250 are formed in a "self-aligning" manner. One or more annealing processes are performed on the semiconductor device 35 to activate the S/D regions 250.

Figure 5:
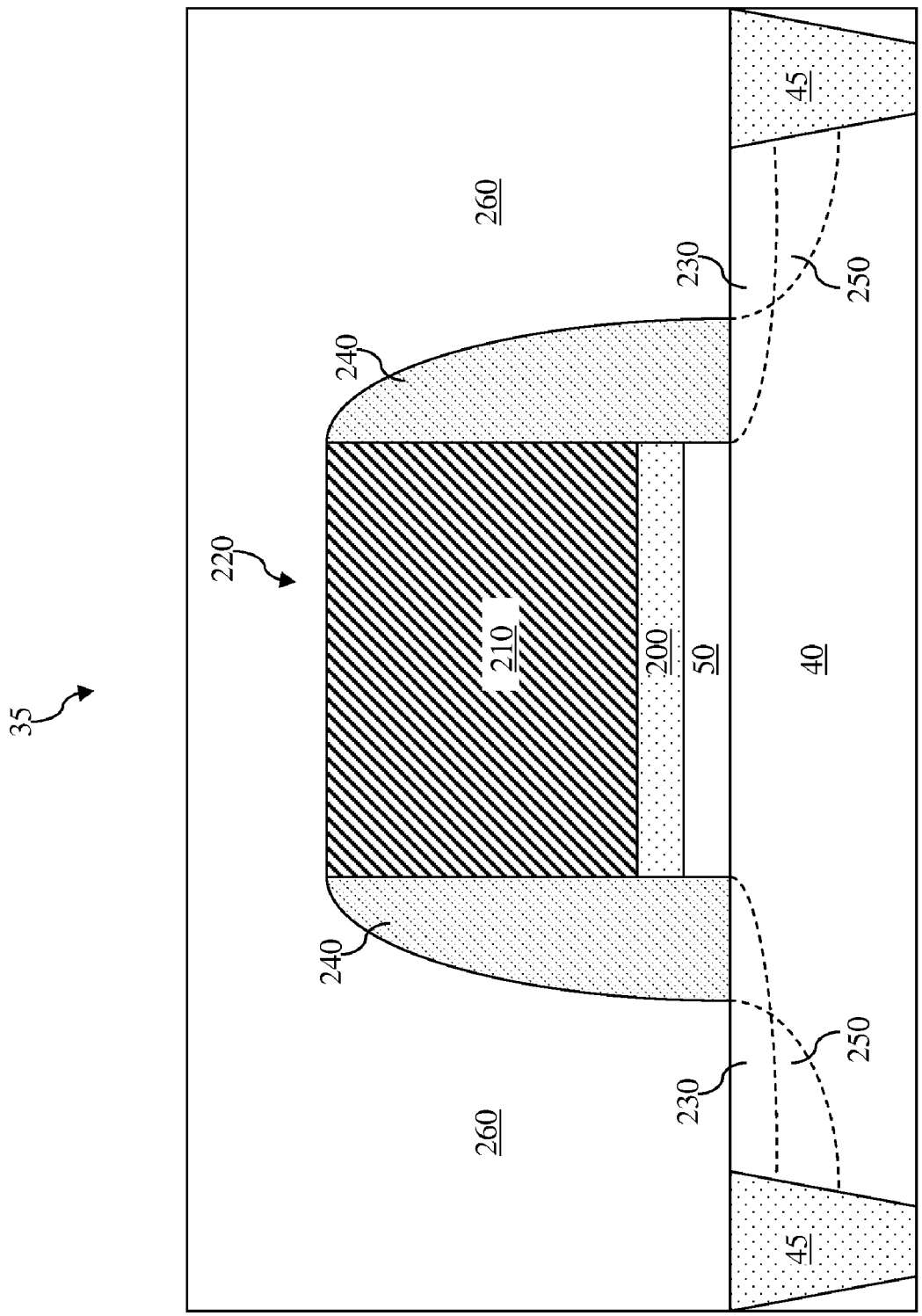

Referring to FIG. 5, an inter-layer (or inter-level) dielectric (ILD) layer 260 is formed over the substrate 40 and the gate structure 220. The ILD layer 260 may be formed by chemical vapor deposition (CVD), high density plasma CVD, spin-on, sputtering, or other suitable methods. In an embodiment, the ILD layer 260 includes silicon oxide. In other embodiments, the ILD layer 260 may include silicon oxy-nitride, silicon nitride, or a low-k material.

Figure 6:
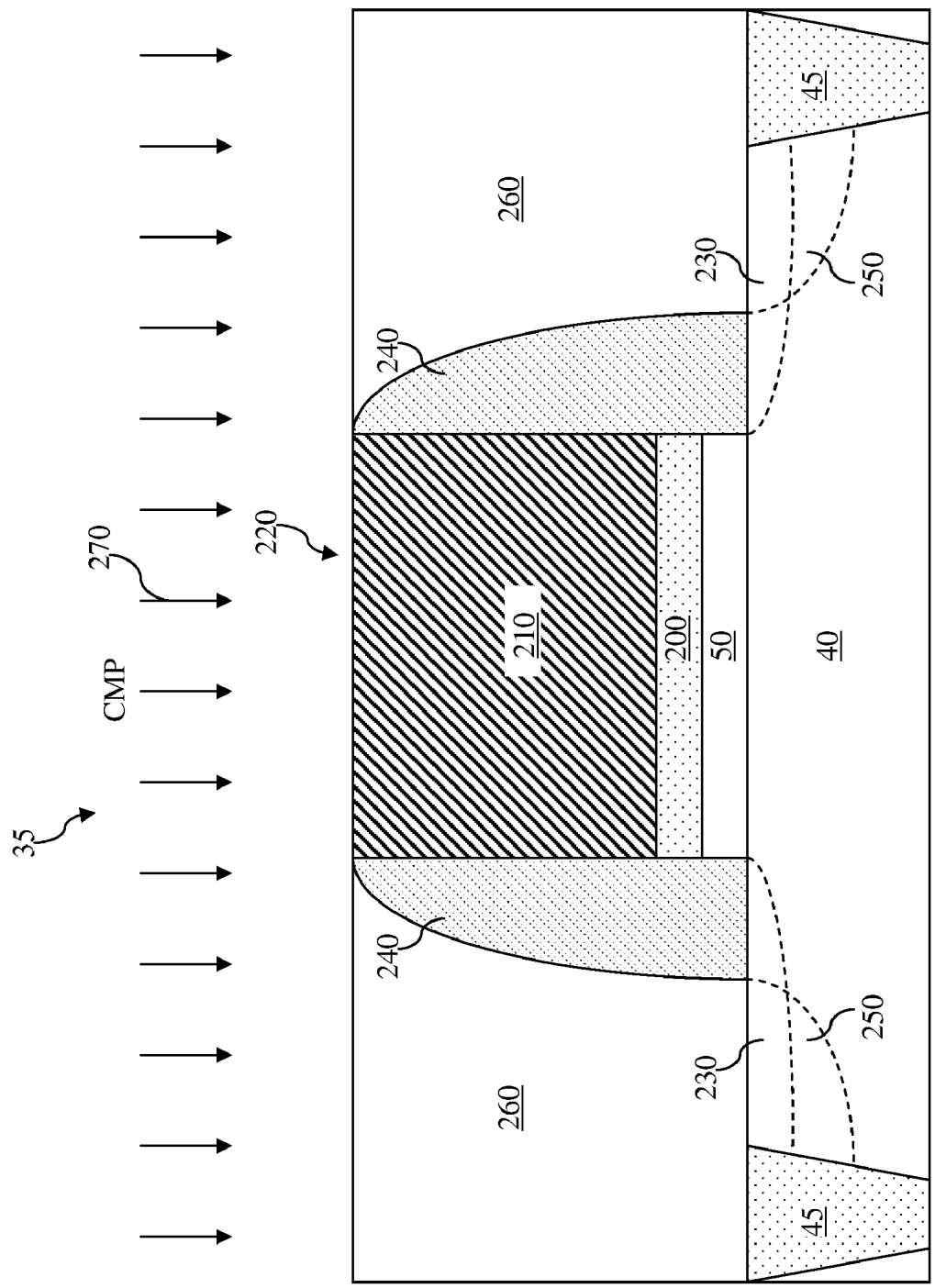

Referring to FIG. 6, a chemical-mechanical-polishing (CMP) process 270 is performed on the ILD layer 260 to expose a top surface of the gate structure 220. Following the CMP process 270, the top surface of the gate structure 220 is substantially co-planar with the top surface of the ILD layer 260 on either side of the gate structure 220.

Figure 7:
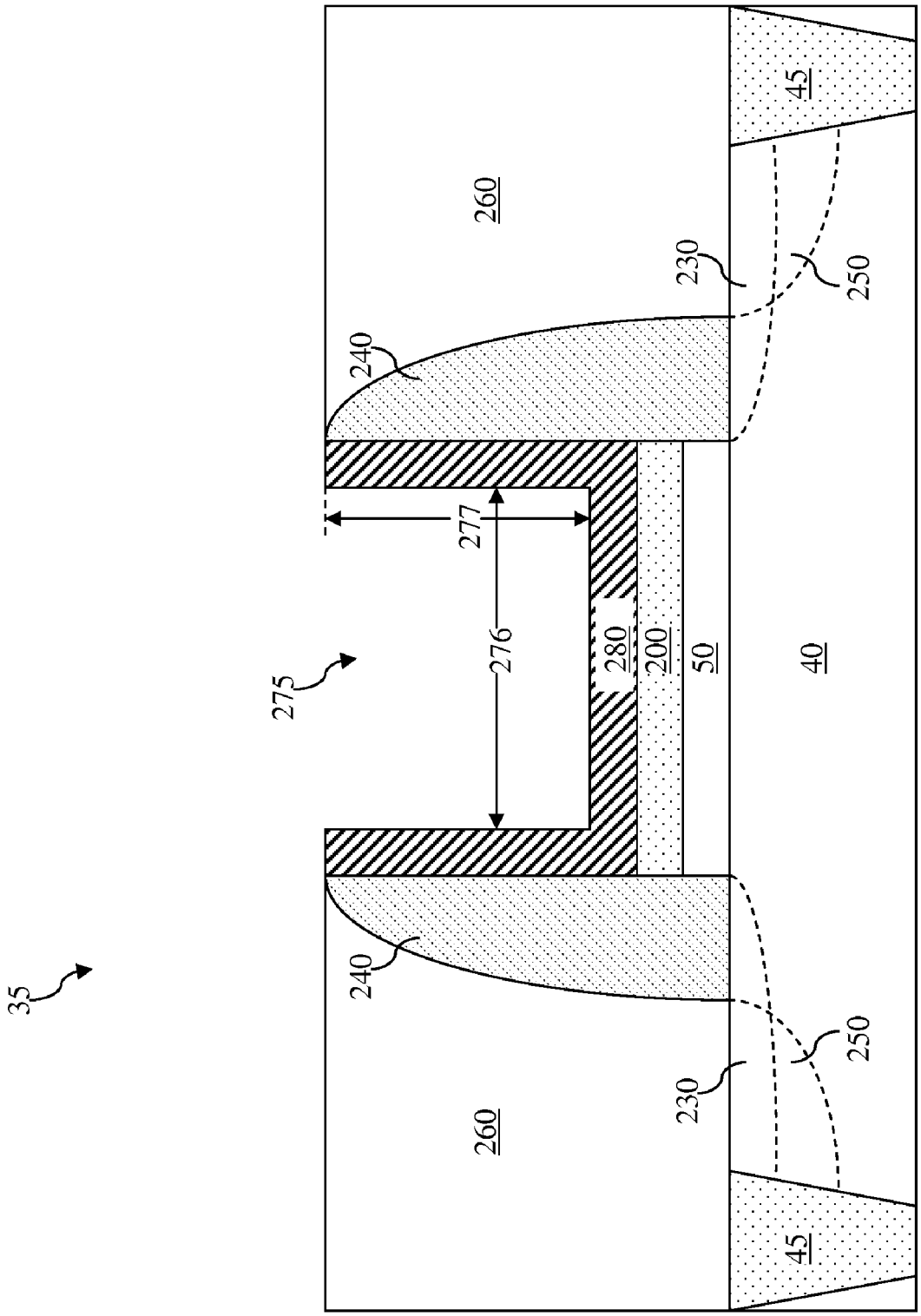

Referring to FIG. 7, the gate electrode layer 210 is removed, thereby forming a trench (or opening) 275 in place of the gate electrode layer 210. The gate electrode layer 210 may be removed in a wet etching or a dry etching process known in the art, while the rest of the layers of the semiconductor device 35 remain substantially un-etched, including the gate dielectric layer 200, the gate spacers 240, and the ILD layer 260. Since the gate electrode layer 210 is removed, it is also referred to as a "dummy gate electrode."

A metal layer 280 is then formed within the trench 275 and over the gate dielectric layer 200. The metal layer 280 includes one of TiN, TaN, TaC, TaSiN, WN, TiAl, TiAlN, and combinations thereof. The metal layer 280 may be formed by CVD, physical vapor deposition (PVD), or another suitable technique. The metal layer 280 tunes a work function of the semiconductor device 35 so that a desired threshold $V_t$ voltage is achieved. Thus, the metal layer 280 may also be referred to as a work function metal layer.

The trench 275 now has a width 276 that is in a range from approximately 10 nanometers (nm) to about 20 nm and a depth 277 that is in a range from approximately 15 nm to about 25 nm. In other embodiments, the width 276 may be smaller than 10 nm, and the depth 277 may be greater than 25 nm.

Figure 8:
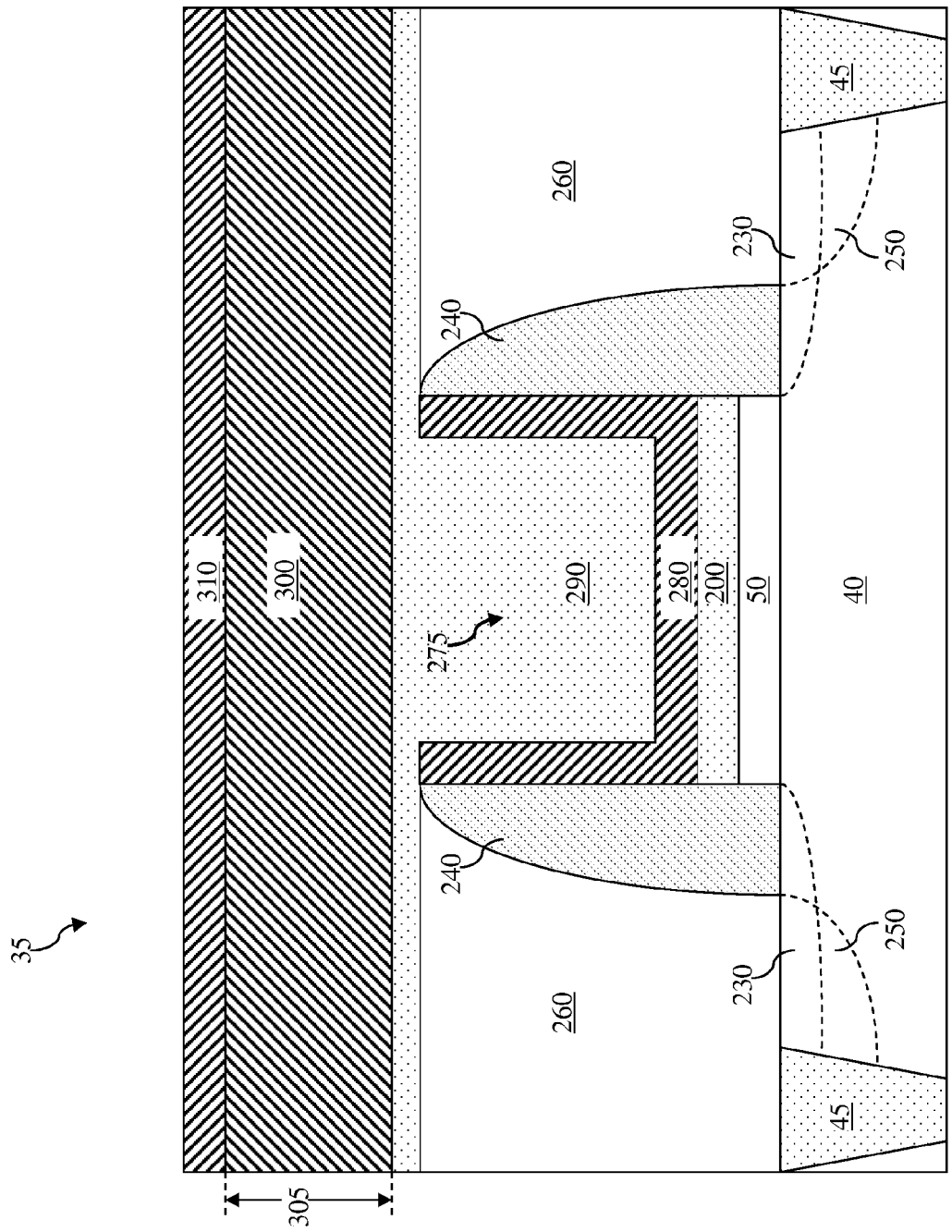

Now, the process of filling the trench 275 with a conductive material will be discussed in accordance with one embodiment of the method 11 of FIG. 1. Referring now to FIG. 8, a silicon material 290 is formed to fill the trench 275. In the present embodiment, the silicon material 290 include polysilicon. In another embodiment, the silicon material 290 includes amorphous silicon. Referring back to FIG. 8, the polysilicon material 290 is formed using a low pressure chemical vapor deposition (LPCVD) process known in the art, which is performed at a relatively low temperature (as compared to the temperature range of traditional CVD processes) from approximately 400 degrees Celsius to approximately 450 degrees Celsius. Such range of low temperatures is chosen so that the S/D regions 250, the gate dielectric layer 200, and the work function metal layer 280 do not become damaged during the process to form the polysilicon material 290, since these layers may not be able to withstand temperatures much higher than 450 degrees Celsius.

Thereafter, a conductive layer 300 is formed over the polysilicon material 290. The conductive layer 300 is formed by a PVD process and has a thickness 305 that is in a range from approximately 200 nm to approximately 600 nm. The target used for the PVD process to form the conductive layer 300 is chosen in a manner so that the target has relatively low silicon content, for example, silicon content from approximately 0.4% to approximately 0.6%. As a result, the conductive layer 300 has relatively low silicon content. The conductive layer 300 in FIG. 8 includes mostly aluminum, but may include mostly copper or mostly tungsten in alternative embodiments. A conductive layer 310 is then formed over the conductive layer 300. The conductive layer 310 is formed by a PVD process and includes titanium. The PVD process to form the conductive layer 310 is performed at a room temperature of approximately 25 degrees Celsius. In other embodiments, the conductive layer 310 may include a material different from titanium but that can easily react with silicon to form silicide, such as nickel or cobalt.

Figure 9:
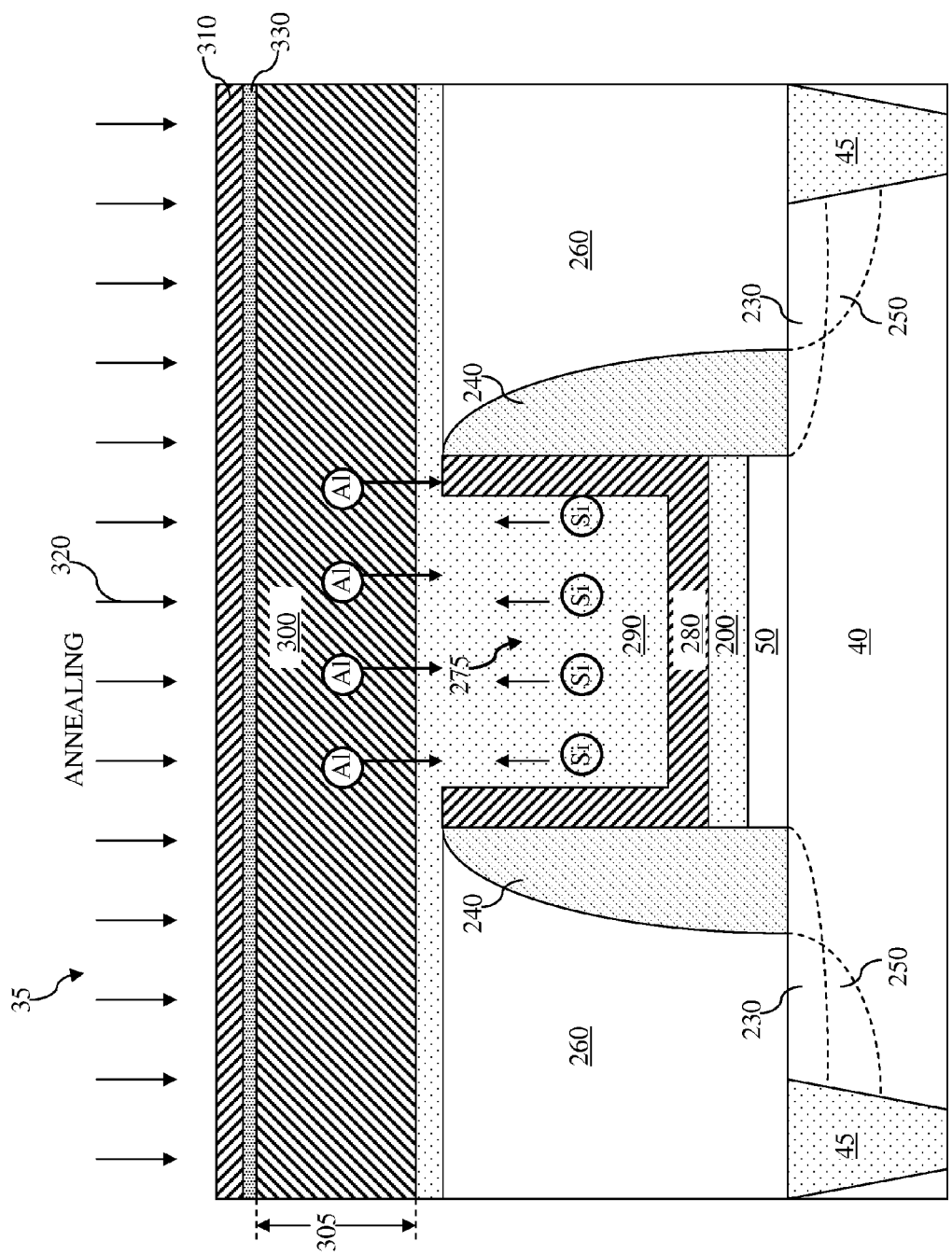

Referring now to FIG. 9, an annealing process 320 is performed on the semiconductor device 35. The annealing process 320 is performed at a temperature that is in a range from approximately 350 degrees Celsius to approximately 450 degrees Celsius, for example at approximately 400 degrees Celsius. The annealing process 320 is performed for a duration of approximately 2-3 minutes. During the annealing process 320, the silicon atoms in the polysilicon material 290 are absorbed into the conductive layer 300. Meanwhile, the atoms in the conductive layer 300 (aluminum atoms in this embodiment) move into the trench 275 to replace the silicon atoms that are absorbed by the conductive layer.

Recall that the depth 277 of the trench 275 is approximately 15-25 nm. The polysilicon material 290 fills the trench 275 and has a thickness not much greater than the depth 277. For example, the polysilicon material 290 may have a thickness than is approximately 30 nm. Also recall that the thickness 305 of the conductive layer 300 is between approximately 200 nm and approximately 600 nm, which is much greater than the thickness of the polysilicon material 290. This relatively big size difference between the thicknesses of the conductive layer 300 and the polysilicon material 290 allows for a more effective absorption of the silicon atoms into the conductive layer, as well as a more effective replacement of the silicon atoms by the aluminum atoms of the conductive layer 300 to fill the trench 275. In addition, due to the use of a PVD target having a low silicon content, the conductive layer 300 has a low silicon content, which means that the silicon atoms (from the polysilicon material 290) absorbed into the conductive material 300 will not quickly reach a saturation level. This also makes the silicon absorption process more effective. It is also understood that the silicon absorption process may partially occur before the annealing process 320 and during the formation of the conductive layer 300, although at a slower pace. The annealing process 320 facilitates or speeds up the silicon absorption process.

In addition, the silicon atoms absorbed into the conductive layer 300 react with the conductive layer 310 above to form a silicide layer 330 at an interface between the conductive layers 300 and 310. In the embodiment shown in FIG. 9, since the conductive layer 310 includes titanium, the silicide layer 330 includes titanium silicide. The formation of titanium silicide lowers the silicon content in the conductive layer 300, making it easier for the conductive layer 300 to absorb more silicon atoms. Hence, the conductive layer 310 also facilitates the silicon absorption process.

Figure 10:
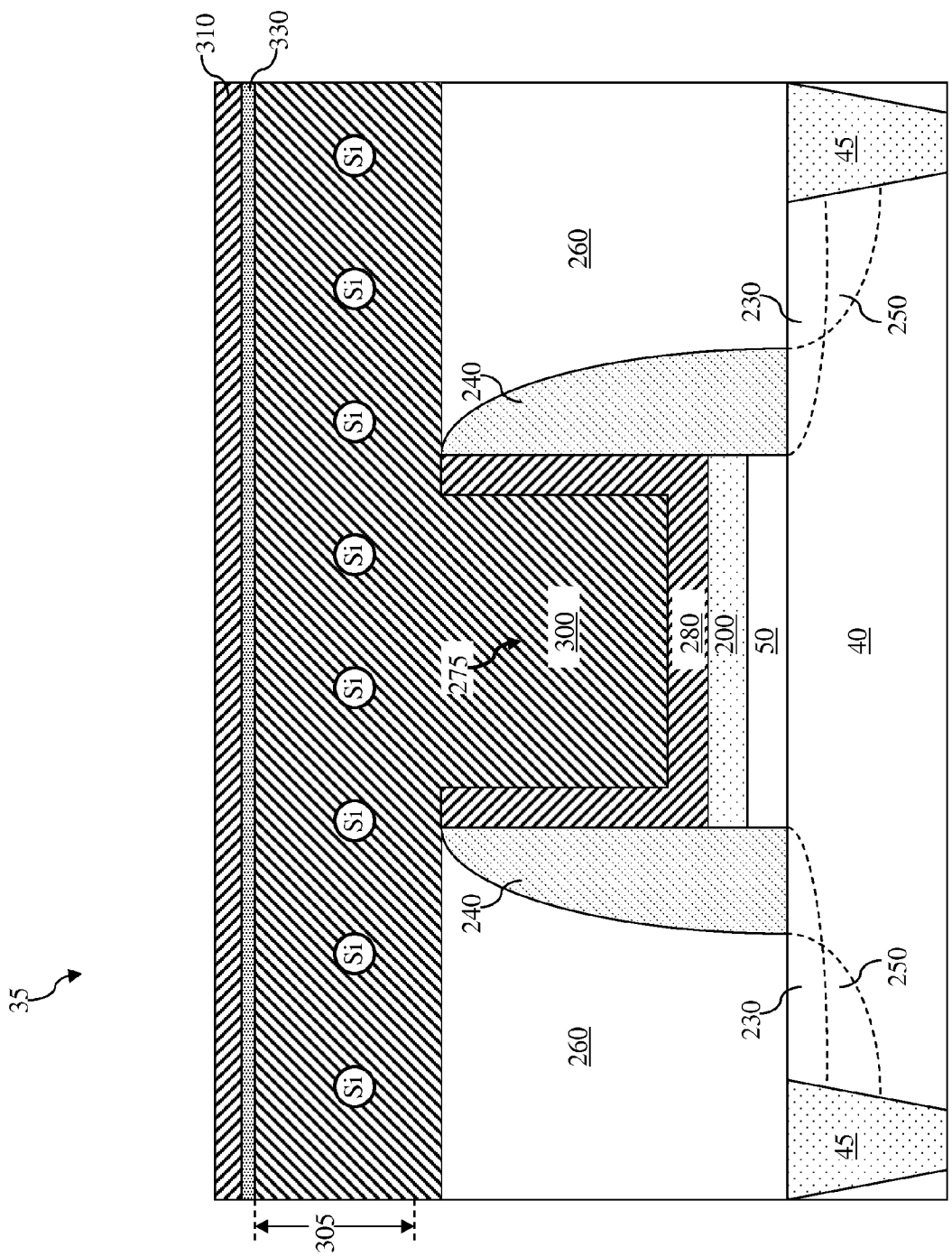
Figure 11:
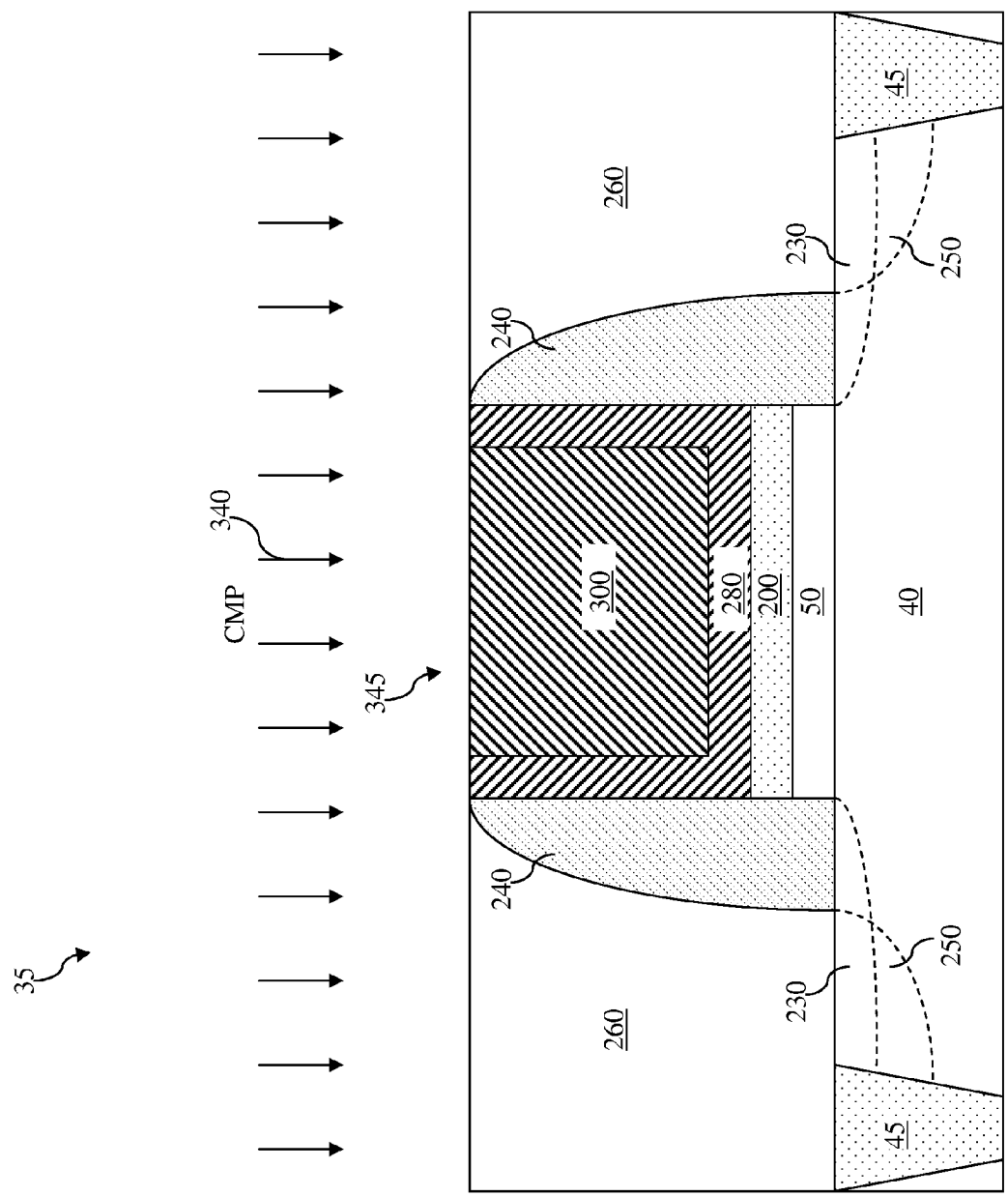

Referring now to FIG. 10, substantially all of the silicon atoms of the polysilicon material 290 have been absorbed into the conductive layer 300, and the trench 275 is now filled by the conductive layer 300. Referring now to FIG. 11, a CMP process 340 is performed on the semiconductor device 35 to remove the conductive layer 310, the silicide layer 330, and the conductive layer 300 that are outside the trench 275. Following the CMP process 340, the conductive layer 300 is substantially co-planar with the ILD layer 260. A gate structure 345 is thus formed by the gate dielectric layer 200, the metal layer 280 and the conductive layer 300. The gate dielectric layer 200 serves as the gate dielectric portion of the gate structure 345, and the conductive layer 300 and the metal layer 280 together form the gate electrode portion for the gate structure 345. Specifically, the conductive layer 300 (also referred to as a fill metal) functions as a main conductive portion of the gate structure 345, and the metal layer 280 tunes a work function of the gate structure 345.

The embodiment of the method 11 of FIG. 1 illustrated by FIGS. 2-11 may be referred to as a polysilicon substitute gate filling method. In existing technologies, a standard CVD or PVD process is used to fill the trench 275 with a conductive material to form the metal gate electrode. However, since the trench 275 is relatively narrow—recall that the width 276 of the trench 275 is between approximately 10-20 nm—it may be difficult for the traditional CVD or PVD processes to completely fill the trench 275 without voids, or air gaps. By using the polysilicon substitute gate filling method discussed above, the relatively narrow trench 275 can be efficiently filled by the conductive layer 300 without voids or air gaps.

Next, an alternative embodiment of the polysilicon substitute gate filling method will be described. The initial fabrication processes for this alternative embodiment are substantially similar to the fabrication processes discussed above with reference to FIGS. 2-6. For the sake of consistency and clarity, similar features are designated the same for these two embodiments. One difference is that, in the alternative embodiment, the gate dielectric layer 200 (FIG. 2) includes silicon oxide instead of a high-k dielectric material. The gate dielectric layer 200 serves as a dummy layer and will be removed later. The optional interfacial layer 50 may not be formed.

Figure 12:
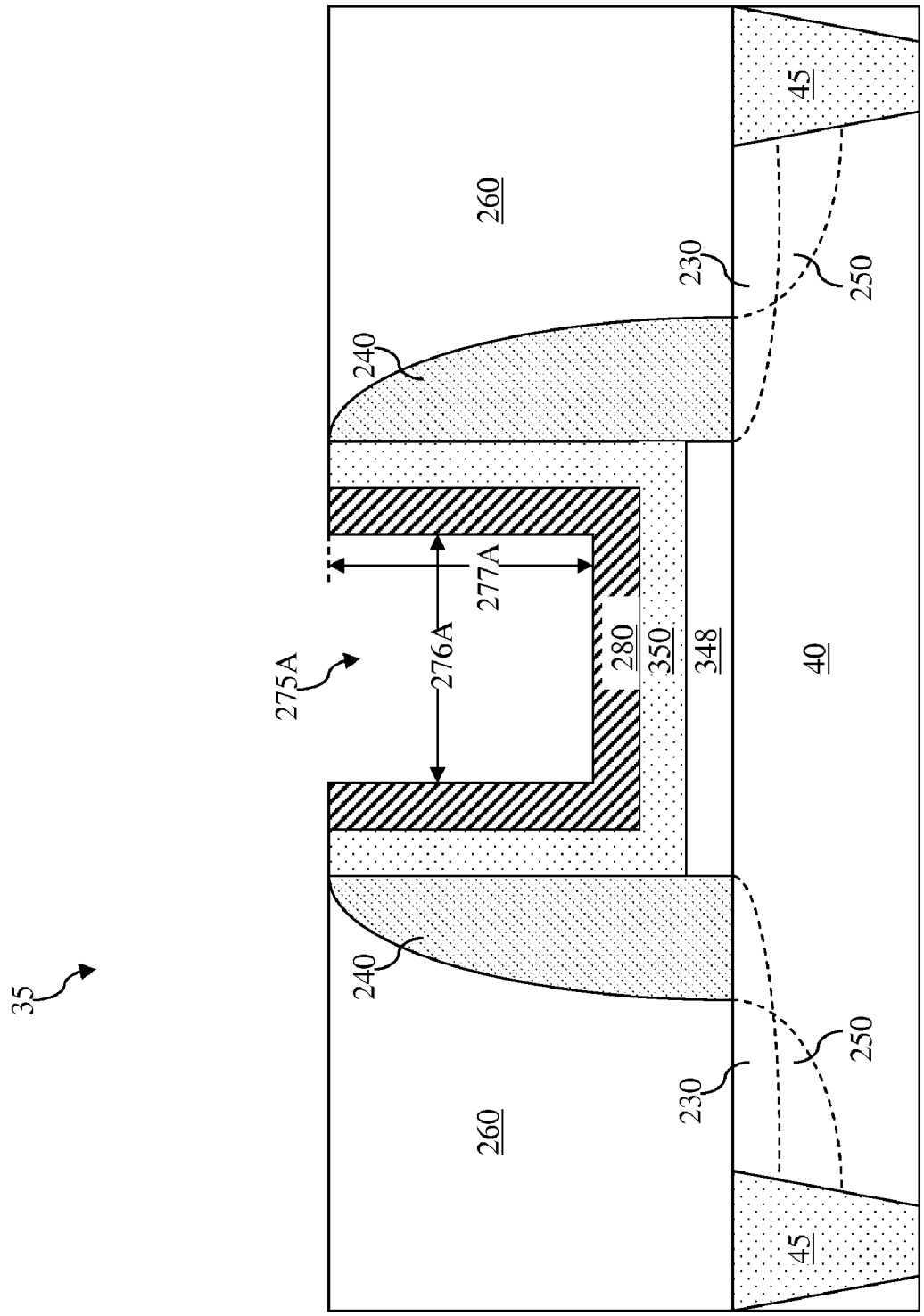

Referring now to FIG. 12, in the alternative embodiment, the gate dielectric layer 200 is removed along with the gate electrode layer 210. The removal of the gate dielectric layer 200 and the gate electrode layer 210 form a trench 275A. An interfacial layer 348 may optionally be formed in the trench 275A. A high-k gate dielectric layer 350 is then formed in the trench 275A and over the interfacial layer 348. The high-k gate dielectric layer 350 includes a high-k material as discussed above with reference to the gate dielectric layer 200 of FIG. 2. Next, the metal layer 280 is formed over the high-k gate dielectric layer 350 to partially fill the trench 275A. The trench 275A now has a width 276A and a depth 277A. The width 276A is smaller than the width 276 (FIG. 7).

Figure 13:
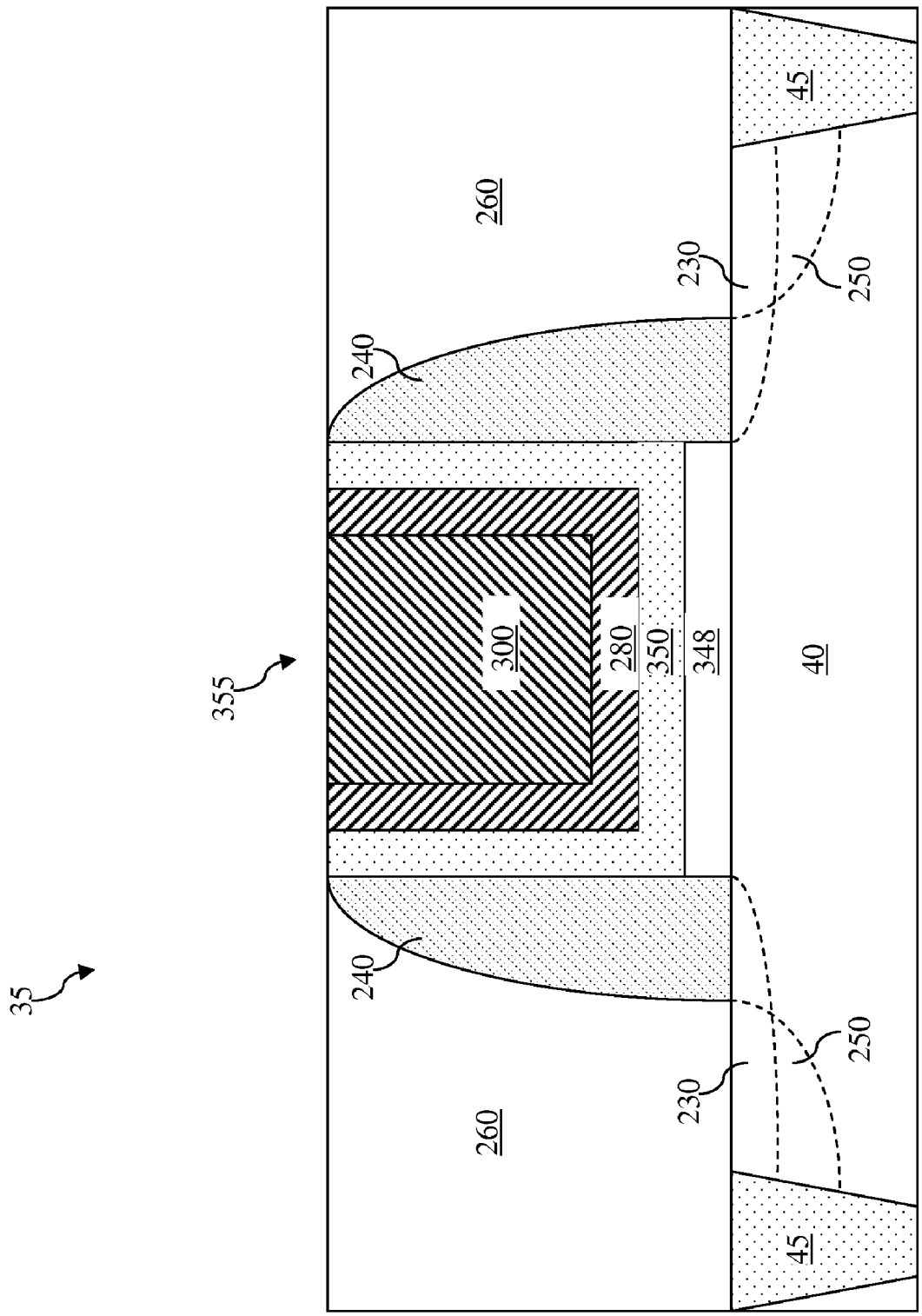

Thereafter, the fabrication processes for this embodiment are substantially similar to the embodiment described above with reference to FIGS. 8-11. Namely, the polysilicon material 290 is formed to fill the trench 275A, the conductive layers 300 is formed over the polysilicon material 290, the conductive layer 310 is formed over the conductive layer 300, the polysilicon material 290 is absorbed into the conductive layer 300 by the annealing process 320, during which the silicide layer 330 is also formed. Eventually, the conductive layer 300 replaces the polysilicon material 290 in the trench 275A, and the CMP process 340 is thereafter performed to remove materials outside the trench 275A, such that the conductive layer 300 is substantially co-planar with the ILD layer 260. A fragmentary diagrammatic cross-sectional side view of the semiconductor device 35 at this stage of fabrication is illustrated in FIG. 13. A gate structure 355 is thus formed by the high-k gate dielectric layer 350, the metal layer 280 and the conductive layer 300. The high-k gate dielectric layer 350 serves as the gate dielectric portion of the gate structure 355, and the conductive layer 300 and the metal layer 280 together form the gate electrode portion for the gate structure 355. The conductive layer 300 functions as a main conductive portion of the gate structure 355, and the metal layer 280 tunes a work function of the gate structure 355.

This alternative embodiment of the polysilicon substitute gate filling method discussed above with reference to FIGS. 12-13 utilizes a "high-k last" approach to fabricate the gate structure 355, whereas the embodiment of the polysilicon substitute gate filling method discussed above with reference to FIGS. 2-11 utilizes a "gate last" approach. Specifically, the alternative embodiment forms the dummy gate dielectric layer 200, which is removed along with the dummy gate electrode layer 210. The high-k gate dielectric layer 350 is later formed after the removal of these dummy layers 200 and 210. Also, since this high-k last approach results in the trench 275A having a smaller width 276A as compared to the width 276 (FIG. 7), it is even more difficult for traditional CVD or PVD methods to fill the trench 275A without voids or air gaps. Nevertheless, for reasons similar to those discussed above with reference to FIGS. 8-10, the alternative embodiment of the polysilicon substitute gate filling method is capable of filling the trench 275A substantially without voids as well.

Figure 14:
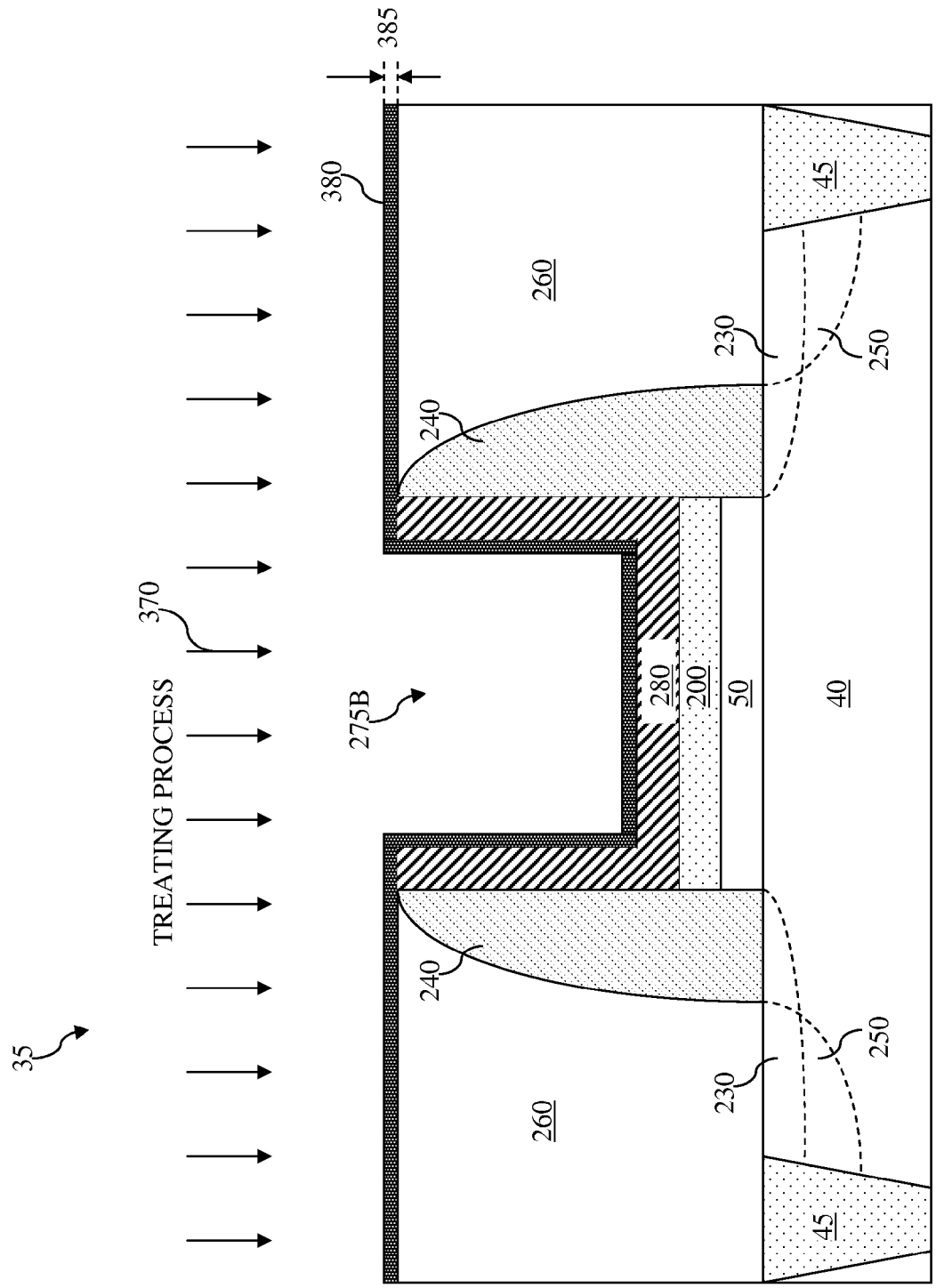
Figure 15:
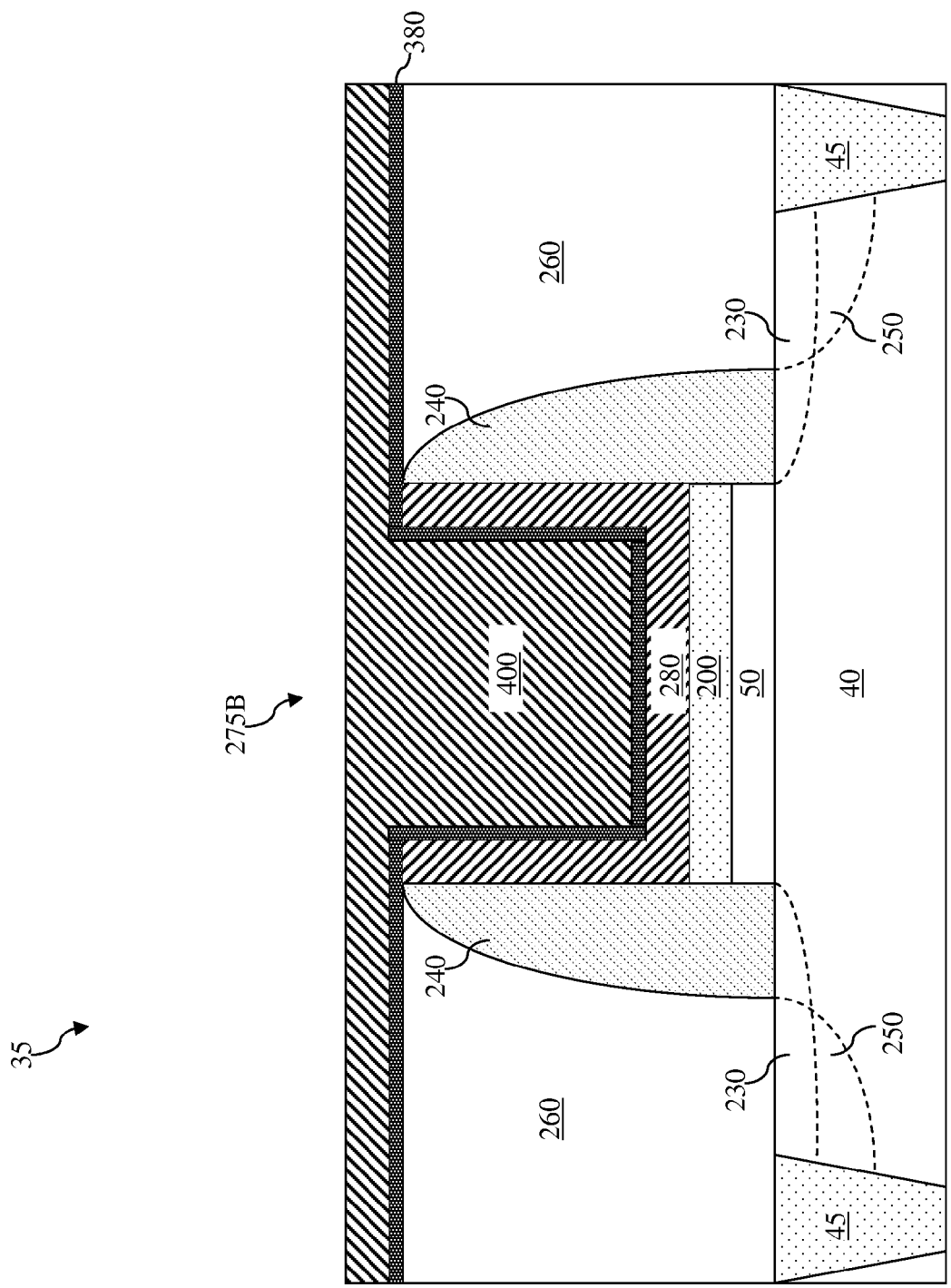
Figure 16:
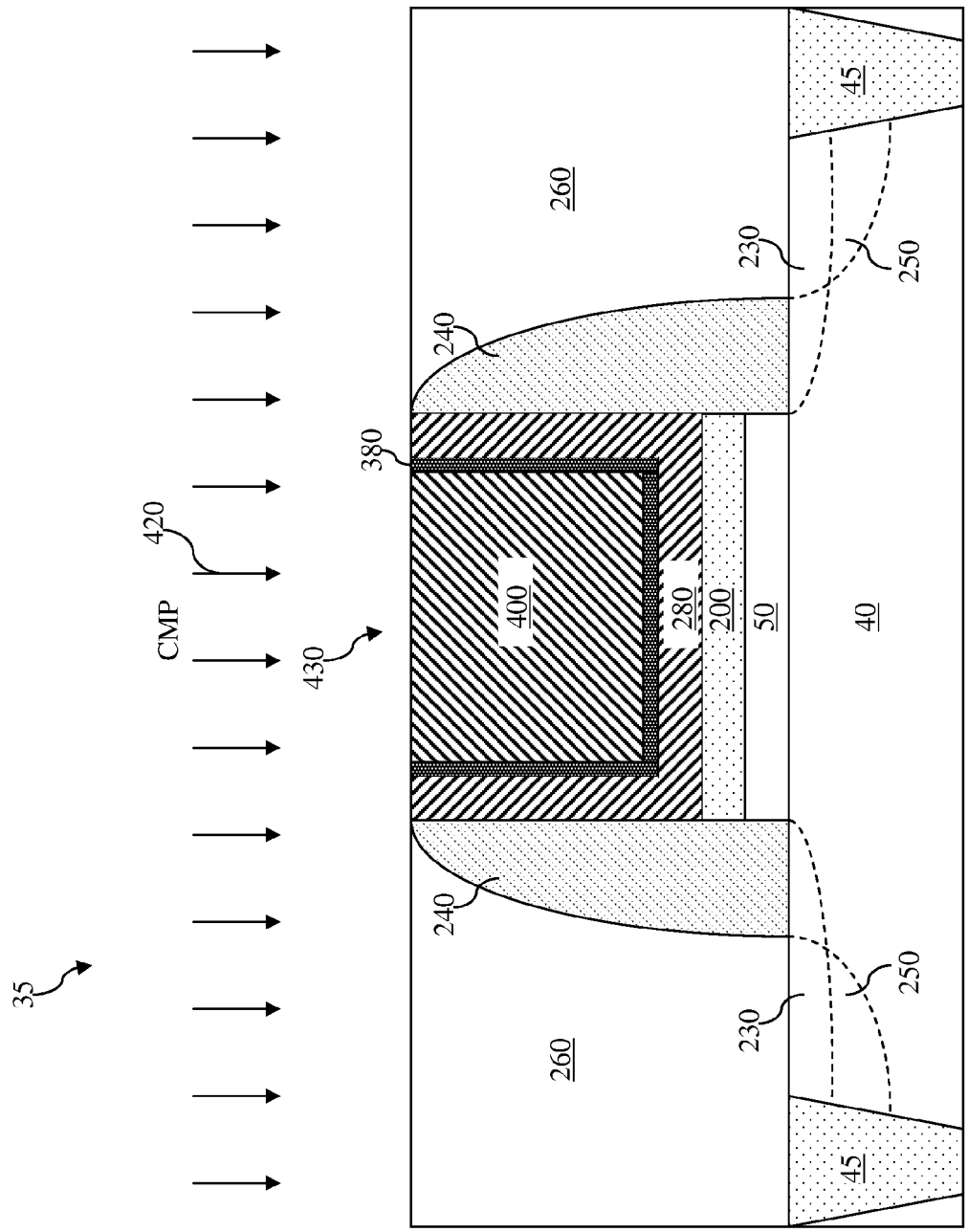

FIGS. 14-16 are diagrammatic fragmentary cross-sectional side views of another embodiment of the method 11 of FIG. 1. The initial fabrication processes of this embodiment are substantially similar to the fabrication processes discussed above with reference to FIGS. 2-6 of the polysilicon substitute gate filling embodiment. For the sake of consistency and clarity, similar features are designated the same for these two embodiments. Referring to FIG. 14, the S/D regions 250, the gate dielectric layer 200, and the metal layer 280 have all been formed, and the gate electrode layer 210 has been removed to form a trench 275B. At this point, the semiconductor device 35 is placed into a nitrogen-filled environment, such as a chamber (not illustrated) filled with nitrogen gas. A treating process 370 is then performed on the semiconductor device 35. The treating process 370 first includes forming a material layer 380 over an exposed surface of the semiconductor device 35, including the exposed surfaces of the trench 275B. In the embodiment shown in FIG. 14, the material layer 380 includes titanium oxide. The material layer 380 is formed by a spin coating process (or "spin-on" process), wherein the semiconductor device is spun at a rate of approximately 3000 revolutions per minute (rpm) for approximately 10 seconds. The material layer has a thickness 385 that is in a range between approximately 2 nm and approximately 3 nm. After the formation of the material layer 380, the treating process 370 proceeds by baking the semiconductor device 35 at a temperature of approximately 160 degrees Celsius for approximately 30 minutes.

Referring now to FIG. 15, a conductive layer 400 is formed over the material layer 380 in another spin coating process, wherein the semiconductor device is spun at a rate of approximately 600 rpm for approximately 10 seconds. The conductive layer 400 includes aluminum in the embodiment shown in FIG. 15, but may include copper or tungsten in alternative embodiments. The conductive layer 400 fills the trench 275B. Here, the material layer 380 serves as a wetting layer for the conductive layer 400, so that aggregation or agglomeration of the conductive layer 400 on the exposed surfaces of the semiconductor device 35 is substantially reduced. As such, the conductive layer 400 is able to substantially fill the trench 275 without voids or air gaps. The thickness 385 of the material layer 380 is chosen to be greater than 2 nm to help reduce the aggregation or agglomeration of the conductive layer 400. Further, the material layer 380 helps reduce diffusion of the conductive layer 400 into its adjacent layers, such as diffusion into the gate spacers 240. Thus, the material layer 380 serves as a diffusion-blocking layer in addition to serving as a wetting layer.

After the formation of the conductive layer 400, the semiconductor device 35 is baked at a temperature that is approximately 150 degrees Celsius for about 10 minutes. Thereafter, the semiconductor device 35 is annealed at a temperature that is approximately 300 degrees for approximately 30 minutes. Referring now to FIG. 16, a CMP process 420 is performed on the semiconductor device 35 to remove portions of the conductive layer 400 outside the trench 275B. A gate structure 430 is thus formed by the high-k gate dielectric layer 200, the metal layer 280 and the conductive layer 400. The high-k gate dielectric layer 200 serves as the gate dielectric portion of the gate structure 430, and the conductive layer 400 and the metal layer 280 together form the gate electrode portion for the gate structure 430. The conductive layer 400 functions as a main conductive portion of the gate structure 430, and the metal layer 280 tunes a work function of the gate structure 430. Since the embodiment discussed above with reference to FIGS. 14-16 utilize spin coating processes to form the gate structure 430, this embodiment is referred to as a spin coating gate filling method.

Figure 17:
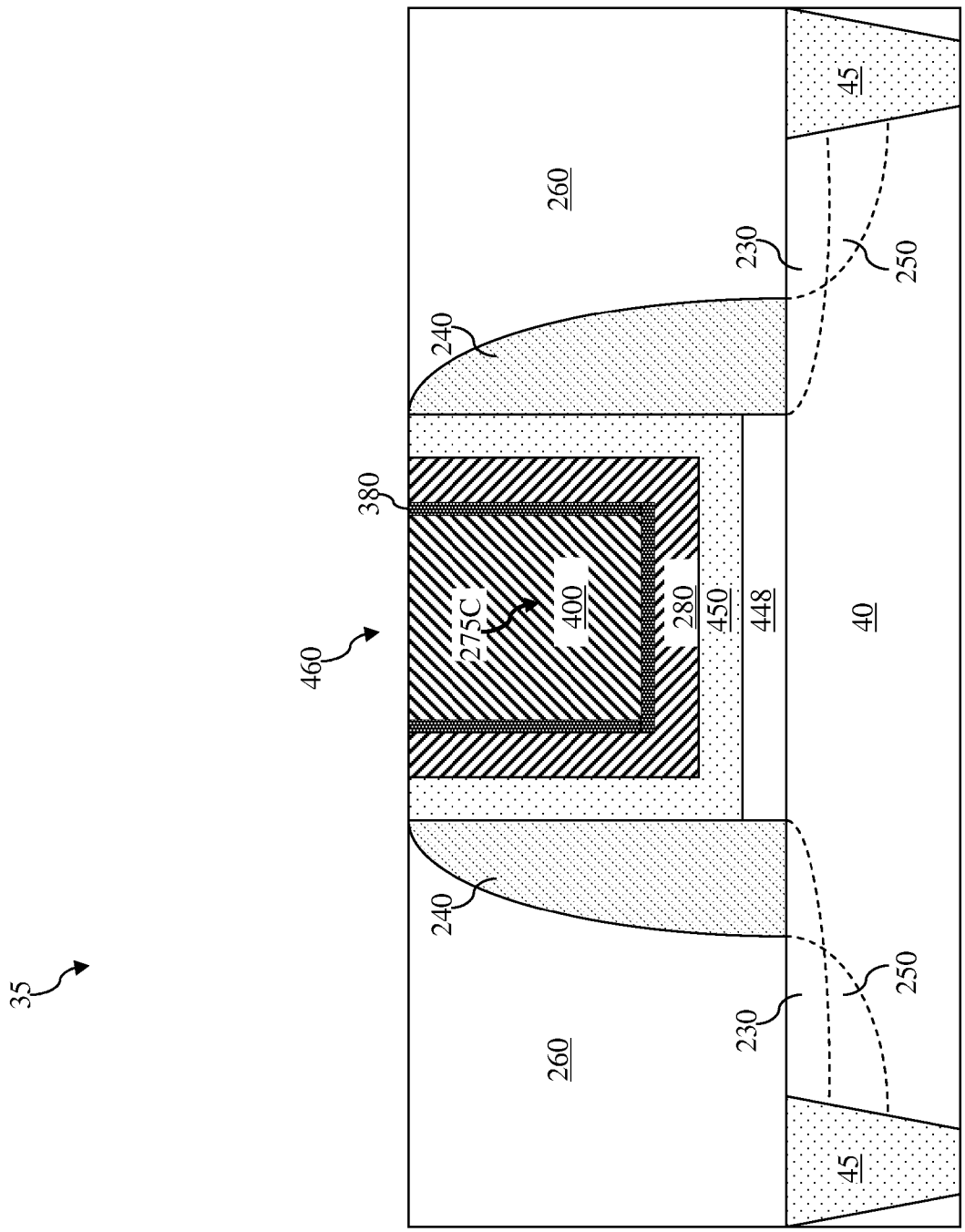

It is understood that the embodiment illustrated in FIGS. 14-16 utilizes the "gate last" approach discussed above. FIG. 17 illustrates an alternative embodiment of the spin coating gate filling method. This alternative embodiment utilizes the "high-k last" approach discussed above with reference to FIGS. 12-13. As such, the dummy gate dielectric layer 200 is removed along with the dummy gate electrode 210 to form the trench 275C, and an optional interfacial layer 448 and a high-k gate dielectric layer 450 is formed in the trench. The subsequent fabrication processes of the alternative embodiment of the spin coating gate filling method are substantially similar to the fabrication processes described with reference to FIGS. 14-16. Namely, the metal layer 280 is formed to partially fill the trench 275C, the wetting layer 380 is formed over the metal layer in a spin coating process, and the conductive layer 400 is formed to fill the trench 275C in another spin coating process. Finally, a CMP process is used to remove portions of the conductive layer 400 outside the trench 275C. Therefore, a gate structure 460 is formed by the high-k gate dielectric layer 450, the metal layer 280 and the conductive layer 400. The high-k gate dielectric layer 450 serves as the gate dielectric portion of the gate structure 460, and the conductive layer 400 and the metal layer 280 together form the gate electrode portion for the gate structure 460. The conductive layer 400 functions as a main conductive portion of the gate structure 460, and the metal layer 280 tunes a work function of the gate structure 460.

It is understood that additional processes may be performed to complete the fabrication of the semiconductor device 35. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein. It is also understood that some of the fabrication processes for the various embodiments discussed above may be combined depending on design needs and manufacturing requirements.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a substrate;
   forming a dummy gate over the substrate;
   forming a dielectric material around the dummy gate;
   removing the dummy gate to form an opening in the dielectric material;
   forming a silicon material in the opening;
   forming a first conductive layer over the silicon material;
   forming a second conductive layer over the first conductive layer; and
   performing an annealing process in a manner such that the silicon material in the opening is replaced by the first conductive layer.

2. The method of claim 1, wherein the annealing process is carried out at a temperature that is less than approximately 450 degrees Celsius.

3. The method of claim 1, wherein the opening has a width that is in a range from approximately 10 nanometers to approximately 20 nanometers and a depth that is in a range from approximately 10 nanometers to approximately 30 nanometers, and the forming the first conductive layer is carried out in a manner so that the first conductive layer has a depth that is in a range from approximately 200 nanometers to approximately 600 nanometers.

4. The method of claim 1, wherein the forming the silicon material is carried out using a low pressure chemical vapor deposition process, and wherein the forming the first conductive layer is carried out using a physical vapor deposition process, and wherein a target used in the physical vapor deposition process has a silicon content that is less than X, X being in a range from approximately 0.4% to approximately 0.6%.

5. The method of claim 1, wherein the annealing process is carried out in a manner such that the silicon material is substantially absorbed into the first conductive layer, and a portion of the absorbed silicon material reacting with the second conductive layer to form a silicide interface between the first and second conductive layers.

6. The method of claim 1, wherein the silicon material includes polysilicon, and wherein the first conductive layer includes one of aluminum, copper, and tungsten, and wherein the second conductive layer includes one of titanium, nickel, and cobalt.

7. The method of claim 1, further including, after the performing the annealing process, performing a chemical-mechanical polishing process on the semiconductor device to remove the various material layers outside the opening.

8. The method of claim 1, further including, after the removing the dummy gate, forming a high-k gate dielectric layer in the opening, and forming a work function metal layer over the high-k gate dielectric layer, wherein the silicon material is formed over the work function metal layer.

9. The method of claim 1, further including:
   before the forming the dummy gate, forming a high-k gate dielectric layer over the substrate; and
   after the removing the dummy gate and before the forming the silicon material, forming a work function metal layer over the high-k gate dielectric layer.

10. A method of fabricating a semiconductor device, comprising:
    providing a substrate;
    forming a dummy gate over the substrate;
    forming a dielectric material around the dummy gate;
    removing the dummy gate to form an opening in the dielectric material;
    forming a wetting layer in the opening; and
    forming a conductive layer over the wetting layer in the opening with a spin coating process.

11. The method of claim 10, further including:
    after the forming the wetting layer and before the forming the conductive layer, baking the wetting layer at approximately 160 degrees Celsius for approximately 30 minutes;
    after the forming the conductive layer, baking the conductive layer at approximately 150 degrees Celsius for approximately 10 minutes; and
    thereafter performing an annealing process at approximately 300 degrees Celsius for approximately 30 minutes.

12. The method of claim 10, wherein the forming the wetting layer and the forming the conductive layer are each carried out in a nitrogen-filled environment.

13. The method of claim 10, wherein:
    the forming the wetting layer is carried out so that the wetting layer includes titanium oxide; and
    the forming the conductive layer is carried out so that the conductive layer includes aluminum.

14. The method of claim 10, wherein the wetting layer is formed with a further spin coating process.

15. The method of claim 14, wherein:
    the spin coating process used to form the wetting layer is carried out at a spin rate of approximately 3000 revolutions per minute for approximately 10 seconds; and
    the spin coating process used to form the conductive layer is carried out at a spin rate of approximately 600 revolutions per minute for approximately 10 seconds.

16. The method of claim 10, further including, after the removing the dummy gate, forming a high-k gate dielectric layer in the opening, and forming a work function metal layer over the high-k gate dielectric layer, wherein the wetting layer is formed over the work function metal layer.

17. The method of claim 10, further including:
    before the forming the dummy gate, forming a high-k gate dielectric layer over the substrate; and
    after the removing the dummy gate and before the forming the wetting layer, forming a work function metal layer over the high-k gate dielectric layer.

18. A method of fabricating a semiconductor device, comprising:
    providing a substrate;
    forming a dummy gate over the substrate;
    forming a dielectric material around the dummy gate;
    removing the dummy gate to form an opening in the dielectric material;
    forming a work function metal layer to partially fill the opening; and
    filling a remainder of the opening with a conductive layer using one of a polysilicon substitute method and a spin coating method;
    wherein:

the polysilicon substitute method includes forming a silicon material in the opening and replacing the silicon material with a conductive material through an annealing process; and the spin coating method includes a first spin coating process that forms a wetting layer in the opening and a second spin coating process that forms a conductive layer over the wetting layer.

19. The method of claim 18, wherein the polysilicon substitute method includes:

forming the silicon material in the opening with a low pressure chemical vapor deposition process;

forming a first conductive layer over the silicon material with a physical vapor deposition process that includes using a target having a silicon content that is less than approximately 0.4%, wherein the first conductive layer includes the conductive material;

forming a second conductive layer over the first conductive layer, the second conductive layer being reactive with silicon; and performing the annealing process in a manner such that the silicon material in the opening is substantially absorbed into the first conductive layer, and a portion of the absorbed silicon material reacting with the second conductive layer to form a silicide layer between the first and second conductive layers.

20. The method of claim 18, wherein the spin coating method includes:

forming the wetting layer in the opening with the first spin coating process that includes a spin rate of approximately 3000 revolutions per minute for approximately 10 seconds;

baking the wetting layer at approximately 160 degrees Celsius for approximately 30 minutes;

forming the conductive layer over the wetting layer in the opening with the second spin coating process that includes a spin rate of approximately 600 revolutions per minute for approximately 10 seconds;

baking the conductive layer at approximately 150 degrees Celsius for approximately 10 minutes; and thereafter annealing the semiconductor device at approximately 300 degrees Celsius for approximately 30 minutes.

* * * * *